US010483091B1

(12) United States Patent
Clevenger et al.

(10) Patent No.: US 10,483,091 B1
(45) Date of Patent: Nov. 19, 2019

(54) SELECTIVE ION FILTERING IN A MULTIPURPOSE CHAMBER

(71) Applicant: International Business Machines Corporation, Armonk, NY (US)

(72) Inventors: Lawrence A. Clevenger, Saratoga Springs, NY (US); Roger Allan Quon, Rhinebeck, NY (US); Theodorus E. Standaert, Clifton Park, NY (US); Wei Wang, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/984,101

(22) Filed: May 18, 2018

(51) Int. Cl.
*H01L 21/322* (2006.01)
*H01J 37/32* (2006.01)
*H01L 21/30* (2006.01)

(52) U.S. Cl.
CPC .... *H01J 37/32422* (2013.01); *H01L 21/3003* (2013.01); *H01J 2237/335* (2013.01)

(58) Field of Classification Search
CPC .................................................. H01L 21/3003
USPC ........................................................ 438/475
See application file for complete search history.

(56) References Cited

U.S. PATENT DOCUMENTS

| 5,605,637 A | 2/1997 | Shan et al. |
|---|---|---|
| 6,693,030 B1 | 2/2004 | Subrahmanyan et al. |
| 7,053,002 B2 | 5/2006 | Cohen et al. |
| 7,658,802 B2 | 2/2010 | Fu et al. |
| 7,704,887 B2 | 4/2010 | Fu et al. |
| 7,972,933 B2 | 7/2011 | Olsen et al. |
| 8,808,564 B2 | 8/2014 | Rogers et al. |
| 2004/0219737 A1 | 11/2004 | Quon |
| 2010/0099251 A1 | 4/2010 | Fu et al. |
| 2016/0079062 A1* | 3/2016 | Zheng .............. H01L 21/02661 438/498 |
| 2017/0213709 A1* | 7/2017 | Wu .................... H01J 37/32862 |
| 2019/0067006 A1* | 2/2019 | Hawrylchak ..... H01L 21/02658 |

FOREIGN PATENT DOCUMENTS

WO        00/34997 A1    6/2000

OTHER PUBLICATIONS

C.C. Yang et al., "Pre-liner dielectric nitridation for resistance reduction in copper interconnects", in Interconnect Technology Conference/Advanced Metallization Conference (IITC/AMC), Proc. IEEE International. May 2016. pp. 89-91.

* cited by examiner

*Primary Examiner* — David S Blum
(74) *Attorney, Agent, or Firm* — Vazken Alexanian; Otterstedt, Wallace & Kammer, LLP

(57) ABSTRACT

A multipurpose semiconductor process chamber includes a vessel wall that encloses contiguous first and second volumes of the multipurpose chamber, and means for selectively effectively preventing ions moving across a plane that partitions the first volume from the second volume. For example, the means can include an electromagnet, or at least one permanent magnet, that is operable to impose and remove a magnetic field with field lines extending in the plane.

10 Claims, 2 Drawing Sheets

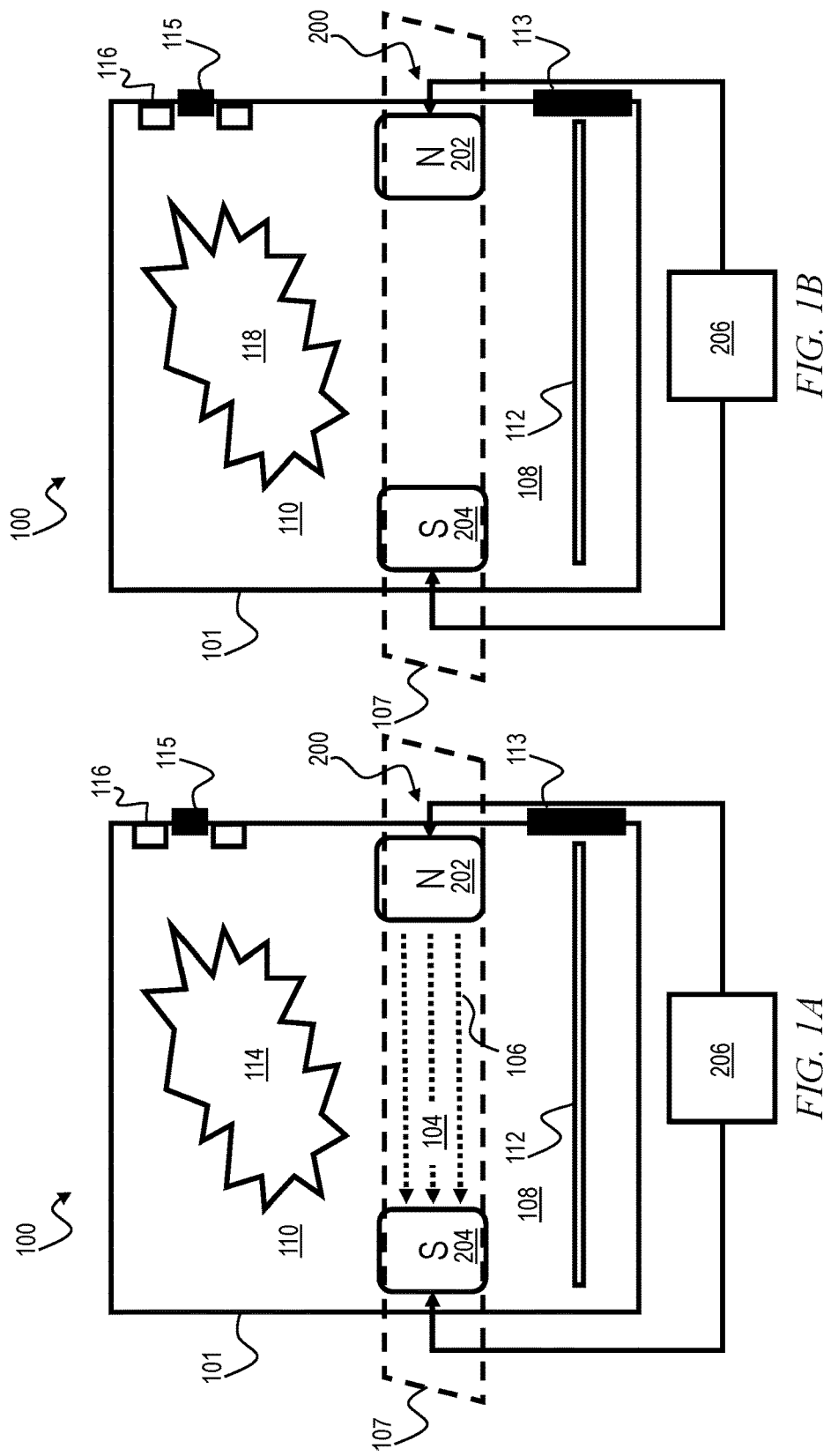

SELECTIVE ION FILTERING IN A MULTIPURPOSE CHAMBER

BACKGROUND

The present invention relates to back-end-of-line (BEOL) semiconductor processing, and more specifically, to preclean and nitridation prior to metallization of copper (Cu) vias.

Currently, preclean is accomplished by placing a semiconductor wafer into a preclean chamber and producing a hydrogen (H) plasma in the preclean chamber. Alternatively, preclean could be accomplished on a singulated die, and throughout the remainder of this disclosure "wafer" is meant to include both bulk wafer and singulated die or plurality of dies. A mechanical ion filter, such as a porous ceramic or quartz screen, is provided in the preclean chamber between the plasma and the die to prevent H+ ions of the plasma contacting and damaging the dielectric structure of the die. Conventionally, the mechanical filter is vacuum sealed to inner walls of the preclean chamber. After preclean, the semiconductor wafer is moved to a nitridation chamber, in which a nitrogen (N) plasma is produced to interact with the dielectric surface. In order to let the nitrogen ions contact the dielectric and accomplish nitridation, the nitridation chamber does not have any ion filter.

SUMMARY

Principles of the invention provide techniques for selective ion filtering in a multipurpose chamber. In one aspect, an exemplary method includes placing a semiconductor wafer into a first volume of a multipurpose chamber having contiguous first and second volumes; establishing a vacuum in the multipurpose chamber; activating an ion filter to effectively prevent ions moving between the first and second volumes; producing a first plasma in the second volume of the multipurpose chamber, such that the ion filter effectively prevents ions of the first plasma entering the first volume; venting the first plasma from the multipurpose chamber; de-activating the ion filter to permit ions to move between the first and second volumes; and producing a second plasma in the second volume of the multipurpose chamber, such that ions of the second plasma interact with the semiconductor wafer.

In another aspect, an exemplary apparatus includes a vessel wall that encloses contiguous first and second volumes of a multipurpose chamber; a first vacuum-sealable opening in the vessel wall for introducing a semiconductor wafer into the first volume of the multipurpose chamber; a second vacuum-sealable opening in the vessel wall for introducing a plasma into the second volume of the multipurpose chamber; and a selective ion filter that is operable between an activated condition in which the selective ion filter effectively prevents ions passing across a plane that partitions the first volume from the second volume, and a de-activated condition in which the selective ion filter permits ions to pass between the first and second volumes.

In another aspect, an exemplary apparatus includes a vessel wall that encloses contiguous first and second volumes of a multipurpose chamber, and means for selectively effectively preventing ions moving across a plane that partitions the first volume from the second volume.

In view of the foregoing, techniques of the present invention can provide substantial beneficial technical effects. For example, one or more embodiments provide one or more of:

Use of a single multipurpose semiconductor process chamber for multiple plasma processes.

Increased throughput of semiconductor wafers in preclean and nitridation due to reduced handling opportunities.

These and other features and advantages of the present invention will become apparent from the following detailed description of illustrative embodiments thereof, which is to be read in connection with the accompanying drawings.

BRIEF DESCRIPTION OF DRAWINGS

FIGS. 1A-1B depict a multipurpose chamber for semiconductor processing, including a first selective magnetic ion filter, and its operation, according to an exemplary embodiment.

DETAILED DESCRIPTION

Figures 2A, 2B:
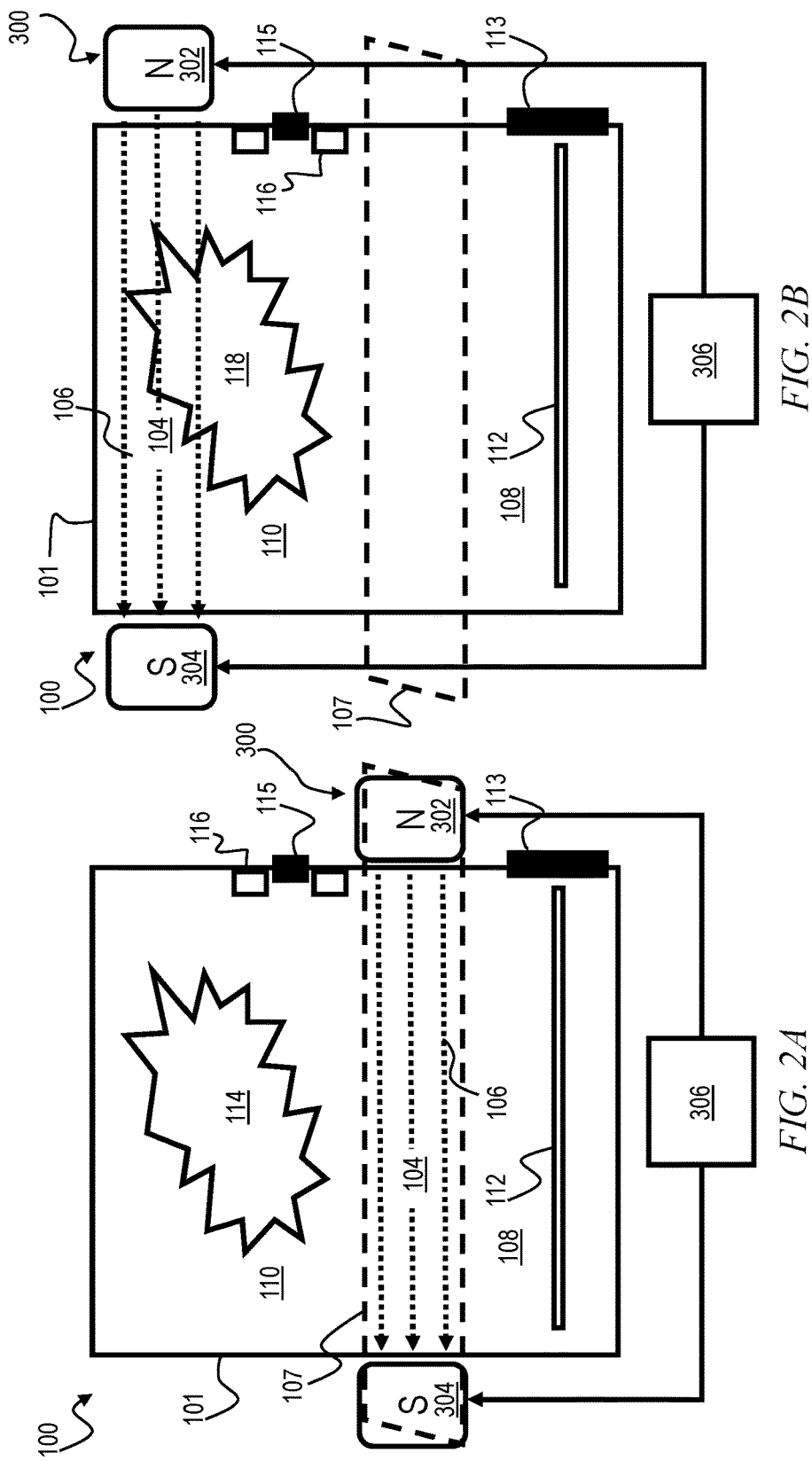
FIGS. 2A-2B depict the multipurpose chamber with a second selective magnetic ion filter, and its operation, according to an exemplary embodiment.

Conventional semiconductor processing techniques require separate process chambers for preclean and nitridation processes. In a preclean chamber, an ion filter is provided to prevent H+ ions interacting and damaging a dielectric surface of the semiconductor wafer that is being precleaned. On the other hand, in a nitridation chamber it is desirable to have N+ ions interact with the dielectric surface; therefore, an ion filter should not be present. The steps involved in moving a die from the preclean chamber to the nitridation chamber introduce delay and potential for error in manufacturing. Accordingly, the inventors recognize that it would be desirable to accomplish preclean and nitridation in a single multipurpose process chamber, and that this could be possible if the ion filter could be repeatedly installed into and removed from the multipurpose chamber.

Installation and removal of a mechanical ion filter, however, presents technical obstacles. For example, the mechanical ion filter typically is vacuum-sealed to the inner walls of the process chamber. Additionally, the mechanical ion filter is installed during initial assembly of the process chamber. Removing the mechanical ion filter from the process chamber would require physically accessing the process chamber, in a manner that would disturb the high vacuum conditions within the process facility. Such disturbance could be deleterious to efficient manufacturing processes and to product quality. Thus, it is believed that physically removing and re-installing a mechanical ion filter in a process chamber could introduce even more delay and potential error than the conventional system of moving a semiconductor wafer from a preclean process chamber to a nitridation process chamber.

Accordingly, one or more embodiments use a selective ion filter that can be activated to effectively partition a multipurpose chamber during a plasma preclean process (thereby preventing ions of a preclean plasma from contacting the semiconductor wafer being precleaned) and that can be de-activated to permit ions of a nitrogen plasma (e.g., $N_2$, $NH_3$) to contact the semiconductor wafer during a nitridation process in the same multipurpose chamber, preferably without breaking vacuum on the multipurpose chamber between preclean and nitridation steps.

The selective ion filter can be implemented as one or more switchable electromagnets, as one or more movable permanent magnets, or as a mechanical ion filter that is movable in reciprocating fashion within the process chamber.

FIGS. 1A-1B depict a multipurpose chamber 100 for semiconductor processing, with a first selective magnetic ion filter 200 according to an exemplary embodiment. The multipurpose chamber 100 includes a vessel wall 101 that encloses contiguous first and second volumes 108, 110 of the chamber 100. Note that throughout the figures, like elements are denoted by like reference characters.

In operation of the multipurpose chamber 100, according to an exemplary embodiment, a semiconductor wafer 112 is introduced into the first volume 108 via a first vacuum-sealable opening 113, the first vacuum-sealable opening 113 is sealed, the selective magnetic ion filter 200 is activated, and then a first plasma 114 is produced in the second volume 110, as shown in FIG. 1A. Typically, the first plasma 114 is produced by introducing a precursor gas or liquid spray into the chamber 100 via a second vacuum-sealable opening 115, while energizing the precursor using an electrode 116 that is mounted to the chamber 100. The first vacuum-sealable opening 113 typically is a shutter door or the like. The second vacuum-sealable opening 115 typically is a sleeve valve or the like.

When the selective magnetic ion filter 200 is activated, it produces a magnetic field 104 with field lines 106 that extend across the chamber 100 within a plane 107 that partitions the first volume 108 from the second volume 110. Thus, the selective magnetic ion filter effectively prevents ions entering the first volume 108 from the plasma 114 in the second volume 110. For example, in certain embodiments a standard ion current density across the plane 107, without the ion filter 200, is 1000 $\mu A/cm^2$; with the ion filter 200 activated, the ion current density drops to ~10 $\mu A/cm^2$. Thus, in some contexts effectively preventing the ions from entering the first volume 108 can be understood to mean reducing the ion current density by about 99%. In other contexts, effectively preventing the ions from entering the first volume 108 can be understood to mean reducing the ion current density by more than 90%.

With the selective magnetic ion filter 200 activated, the semiconductor wafer 112 can be precleaned by producing the first plasma 114 (e.g. a hydrogen plasma) in the second volume 110.

After H radicals of the hydrogen plasma 114 have had sufficient time to interact with the semiconductor wafer 112, the semiconductor wafer 112 can be nitride (e.g.) by venting the hydrogen plasma 114 from the chamber 100 (via the second vacuum-sealable opening 115 or via another opening, not shown), de-activating the selective magnetic ion filter 200, and then producing a second plasma 118 (e.g. a nitrogen plasma) in the chamber 100, as shown in FIG. 1B. Nitrogen precursor for the nitrogen plasma 118 can be supplied via the second vacuum-sealable opening 115 or via another opening, not shown.

After $N^+$ ions of the nitrogen plasma 118 have had sufficient time to interact with the semiconductor wafer 112, vent the nitrogen plasma from the chamber 100, open the first vacuum-sealable opening 113, and remove the wafer 112.

In one or more embodiments, the preceding steps from sealing the first vacuum-sealable opening 113 through venting the nitrogen plasma 118 are accomplished without breaking vacuum on the multipurpose chamber 100.

In addition to activating the selective magnetic ion filter 200, a positive bias voltage can be applied to the semiconductor wafer 112 to repel positively charged ions. On the other hand, when it is desirable to have positive ions interact with the wafer 112, then in addition to de-activating the selective magnetic ion filter 200, a negative or neutral bias voltage can be applied to the wafer to attract positively charged ions.

In one or more embodiments, the selective magnetic ion filter 200 includes a first electromagnet 202, a second electromagnet 204, and control circuitry 206 for energizing and de-energizing the electromagnets. To activate the selective magnetic ion filter 200, as shown in FIG. 1A, the control circuit 206 energizes the electromagnets 202 and 204 with complementary polarities, i.e. a south pole of one magnet faces an opposed (north) pole of the other magnet in the plane 107 that partitions the first volume 108 from the second volume 110. Thus the electromagnets 202, 204 produce the magnetic field 104 with field lines 106 to effectively prevent positive ions entering the first volume 108. On the other hand, to de-activate the selective magnetic ion filter 200, the control circuit 206 de-energizes the electromagnets 202, 204 so that, as shown in FIG. 1B, no magnetic field is produced. Thus, the selective magnetic ion filter 200 is operable to selectively effectively prevent ions moving across the plane 107. Circuitry 206 to activate and control electromagnets is well-known to the skilled artisan.

In one or more embodiments, instead of the two electromagnets 202, 204, a single electromagnet can be used with its north and south poles facing each other in the plane 107.

Typically, the multipurpose chamber 100 is fabricated from a corrosion resistant and non-magnetic material such as a stainless steel (i.e. austenitic rather than ferritic stainless steel). Accordingly, although in FIGS. 1A, 1B the electromagnets 202, 204 are shown inside the vessel wall 101, they could be positioned inside or outside the vessel wall. Other chamber materials could be used in other embodiments, with the magnets appropriately located.

FIGS. 2A-2B depict the multipurpose chamber 100 with a second selective magnetic ion filter 300 according to an exemplary embodiment, in which the selective magnetic ion filter 300 includes a first permanent magnet 302, a second permanent magnet 304, and a movable apparatus 306 for repositioning the permanent magnets. The movable apparatus 306 may be, for example, a screw jack or a rack and pinion driven by a servomotor, a rotary or linear actuator, a hydraulic or pneumatic actuator, etc., which may be disposed inside or outside the multipurpose chamber 100. To activate the selective magnetic ion filter 300, the movable apparatus 306 is operated to position the permanent magnets 302, 304 with their north and south poles facing each other in the plane 107, as shown in FIG. 2A. Thus the permanent magnets 302, 304 produce the magnetic field 104 to effectively prevent positive ions entering the first volume 108. To de-activate the selective magnetic ion filter 300, the movable apparatus 306 is operated to position the permanent magnets 302, 304 out of the plane 107; e.g., the movable apparatus 306 raises the permanent magnets 302, 304 along a vertical axis of the multipurpose chamber 100 to a position above the second volume 110, as shown in FIG. 2B, where the magnetic field 104 will not effectively prevent ions moving from the second volume 110 into the first volume 108. Thus, the selective magnetic ion filter 300 is operable to selectively effectively prevent ions moving across the plane 107.

In one or more embodiments, instead of the two permanent magnets 302, 304, a single permanent magnet can be used with its poles facing each other in the plane 107 in its activated position and out of the plane 107 in its de-activated position. More generally, any movement of a pair of permanent magnets that displaces their opposed poles from the plane 107 would serve to de-activate a selective magnetic ion filter using permanent magnets. For example, one or both of the permanent magnets could be rotated about an axis or axes to separate the opposed poles.

Again, it is typical that the multipurpose chamber 100 would be fabricated from a non-magnetic material. As such, the permanent magnets 302, 304 and the movable apparatus 306 could be positioned outside the vessel wall 101 as shown.

It should be noted that the principles of the invention are not strictly limited to selective magnetic ion filters, but could extend to other sorts of ion filter that can be activated and de-activated within a multipurpose chamber. For example, a mechanical filter could be movably mounted within a multipurpose chamber, and could be made operable by a screw jack, a servomotor, a linear actuator, or the like, so as to move between a deployed or active position partitioning the first and second volumes and a retracted or inactive position above the second volume (thereby not partitioning the first and second volumes), similar to the movement of the selective magnetic ion filter 300. Such a mechanical filter would be operable to selectively effectively prevent ions moving across the plane 107 that partitions the first volume 108 from the second volume 110.

Given the discussion thus far, it will be appreciated that, in general terms, an exemplary method, according to an aspect of the invention, includes placing a semiconductor wafer 112 into a first volume 108 of a multipurpose chamber 100 having contiguous first and second volumes 108, 110; establishing a vacuum in the multipurpose chamber; then activating an ion filter 200 or 300 to effectively prevent ions moving between the first and second volumes. The exemplary method further includes producing a first plasma 114 in the second volume 110 of the multipurpose chamber 100, such that the ion filter 200 or 300 effectively prevents ions of the first plasma entering the first volume 108. After a period of time, the method further includes venting the first plasma 114 from the multipurpose chamber 100; de-activating the ion filter 200 or 300 to permit ions to move between the first and second volumes 108, 110; and producing a second plasma 118 in the second volume 110 of the multipurpose chamber, such that ions of the second plasma interact with the semiconductor wafer 112. It should be noted that the order of steps is exemplary, and certain steps could be interchanged in order without deviating from the principles of the invention.

In one or more embodiments, the first plasma 114 is a hydrogen plasma and the second plasma 118 is a nitrogen plasma, and the multipurpose chamber 100 is used as a combined preclean and nitridation chamber, with the hydrogen plasma 114 cleaning the semiconductor wafer and the nitrogen plasma 118 nitriding the semiconductor wafer.

In one or more embodiments, the first volume 108 of the multipurpose chamber is a lower portion and the second volume 110 of the multipurpose chamber is an upper portion.

In one or more embodiments, the exemplary method further includes, while providing the first plasma 114 in the second volume 110 of the multipurpose chamber 100, repelling positive ions from the semiconductor wafer 112 by establishing a positive electrical charge at the dielectric surface of the semiconductor wafer.

In one or more embodiments, the exemplary method further includes, while providing the second plasma 118 in the second volume 110 of the multipurpose chamber, attracting positive ions to the semiconductor wafer by establishing a negative or neutral electrical charge at the dielectric surface of the semiconductor wafer.

In one or more embodiments, activating the ion filter 200 or 300 comprises imposing a magnetic field 104 with field lines 106 that extend along a plane 107 that partitions the first volume 108 of the multipurpose chamber 100 from the second volume 110 of the multipurpose chamber, and de-activating the ion filter 200 or 300 comprises removing the magnetic field.

In one or more embodiments, imposing the magnetic field 104 includes energizing an electromagnet 202 and/or 204 with poles disposed opposite each other in the plane 107 partitioning the first volume from the second volume.

In one or more embodiments, imposing the magnetic field 104 includes positioning first and second permanent magnets 302, 304 at opposite sides of the multipurpose chamber 100 in a plane 107 partitioning the first and second volumes 108, 110 of the multipurpose chamber, such that opposed poles of the permanent magnets face each other across the multipurpose chamber in the plane partitioning the first volume from the second volume. In one or more embodiments, removing the magnetic field 104 includes repositioning the first and second permanent magnets 302, 304 such that the opposed poles no longer face each other in the plane 107 partitioning the first volume from the second volume. In one or more embodiments, repositioning the first and second permanent magnets 302, 304 includes moving one of the first and second permanent magnets along an axis of the multipurpose chamber perpendicular to the plane 107 partitioning the first volume from the second volume.

In one or more embodiments, the steps are carried out without removing the wafer from the chamber and while maintaining vacuum (e.g., less than 500 mTorr) on the chamber from step-to-step. For example, in a non-limiting embodiment the chamber is maintained at a vacuum ranging from about 1 mTorr to about 500 mTorr.

In another aspect, an exemplary apparatus includes a vessel wall 101 that encloses contiguous first and second volumes 108, 110 of a multipurpose chamber 100; a first vacuum-sealable opening 113 in the vessel wall; a second vacuum-sealable opening and an electrode for producing a plasma 114 or 118 in the second volume 110; and a selective ion filter 200 or 300 that is operable between an activated condition in which the selective ion filter effectively prevents ions passing across a plane 107 that partitions the first volume from the second volume, and a de-activated condition in which the selective ion filter permits ions to pass between the first and second volumes.

In one or more embodiments, the selective ion filter 200 comprises an electromagnet 202 or 204 and control circuitry 206 that is connected to energize the electromagnet to impose a magnetic field 104 with field lines 106 that extend along the plane 107 that partitions the first volume 108 from the second volume 110. In one or more embodiments, the control circuitry 206 is configured to energize the electromagnet 202 or 204 in response to the first vacuum-sealable opening 113 being sealed. In one or more embodiments, the control circuitry 206 is configured to produce a first plasma 114 in the second volume by opening the second vacuum-sealable opening 115 and energizing an electrode 116, in response to a period of time elapsing after energizing the electromagnet 202 and/or 204.

In one or more embodiments, the selective ion filter 300 comprises first and second permanent magnets 302, 304 movably mounted to the chamber 100 and movable into and out of an activated condition in which opposed poles of the first and second permanent magnets face each other in a plane 107 extending across the multipurpose chamber between the first and second volumes 108, 110 of the multipurpose chamber, such that the first and second permanent magnets 302, 304 impose a magnetic field 104 with field lines 106 that extend along the plane 107 that partitions the first volume from the second volume. In one or more embodiments, the first and second permanent magnets 302, 304 are movable between the activated condition and a de-activated condition in which at least one of the first and second permanent magnets is moved away from the plane 107 that partitions the first and second volumes along an axis perpendicular to the plane.

In another aspect, an exemplary apparatus includes a vessel wall 101 that encloses contiguous first and second volumes 108, 110 of a multipurpose chamber 100, and means 200 or 300 for selectively effectively preventing ions moving across a plane 107 that partitions the first volume from the second volume. For example, the means for selectively effectively preventing ions moving across the plane 107 include means 200 or 300 for imposing and removing a magnetic field 104 with field lines 106 that extend along the plane.

In one or more embodiments, the means 200 for imposing and removing the magnetic field 104 include an electromagnet 202 or 204 disposed such that, when energized, the electromagnet produces the magnetic field 104.

In one or more embodiments, the means 300 for imposing and removing the magnetic field 104 include at least one permanent magnet 302 or 304 movably mounted such that, in a first position, the at least one permanent magnet produces the magnetic field 104 in the plane 107, and in a second position the at least one permanent magnet does not produce the magnetic field in the plane.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    placing a semiconductor wafer into a first volume of a multipurpose chamber having contiguous first and second volumes;
    establishing a vacuum in the multipurpose chamber;
    activating an ion filter to effectively prevent ions moving between first and second volumes;
    producing a first plasma in the second volume of the multipurpose chamber, such that the ion filter effectively prevents ions of the first plasma entering the first volume;
    venting the first plasma from the multipurpose chamber;
    de-activating the ion filter to permit ions to move between the first and second volumes; and
    producing a second plasma in the second volume of the multipurpose chamber, such that ions of the second plasma interact with the semiconductor wafer.

2. The method of claim 1 wherein the first plasma is a hydrogen plasma and the second plasma is a nitrogen plasma, and the multipurpose chamber is used as a combined preclean and nitridation chamber, with the hydrogen plasma cleaning the semiconductor wafer and the nitrogen plasma nitridating the semiconductor wafer.

3. The method of claim 1 wherein the first volume of the multipurpose chamber is a lower portion and the second volume of the multipurpose chamber is an upper portion.

4. The method of claim 1 further comprising, while providing the first plasma in the second volume of the multipurpose chamber, repelling positive ions from the semiconductor wafer by establishing a positive electrical charge at the dielectric surface of the semiconductor wafer.

5. The method of claim 1 further comprising, while providing the second plasma in the second volume of the multipurpose chamber, attracting positive ions to the semiconductor wafer by establishing a negative or neutral electrical charge at the dielectric surface of the semiconductor wafer.

6. The method of claim 1 wherein activating the ion filter comprises imposing a magnetic field with field lines that extend along a plane that partitions the first volume of the multipurpose chamber from the second volume of the multipurpose chamber, and de-activating the ion filter comprises removing the magnetic field.

7. The method of claim 6 wherein imposing the magnetic field includes energizing an electromagnet with poles disposed opposite each other in the plane partitioning the first volume from the second volume.

8. The method of claim 6 wherein imposing the magnetic field includes positioning first and second permanent magnets at opposite sides of the multipurpose chamber in a plane partitioning the first and second volumes of the multipurpose chamber, such that opposed poles of the permanent magnets face each other across the multipurpose chamber in the plane partitioning the first volume from the second volume.

9. The method of claim 8 wherein removing the magnetic field includes repositioning the first and second permanent magnets such that the opposed poles no longer face each other in the plane partitioning the first volume from the second volume.

10. The method of claim 1 wherein the ion filter is activated and de-activated without breaking vacuum on the multipurpose chamber.

* * * * *